METHOD OF MAKING A SEMICONDUCTOR DEVICE

Filed July 2, 1970 2 Sheets-Sheet 1

INVENTOR

JIRI SANDERA,

By His Attorneys Spensley, Horn & Lubitz

INVENTOR
JIRI SANDERA,

By His Attorneys
Spensley, Horn & Lubitz

United States Patent Office 3,689,392

Patented Sept. 5, 1972

3,689,392
METHOD OF MAKING A SEMICONDUCTOR DEVICE

Jiri Sandera, Manhattan Beach, Calif., assignor to TRW Inc., Lawndale, Calif.

Filed July 2, 1970, Ser. No. 51,948
Int. Cl. C23c 15/00
U.S. Cl. 204—192 10 Claims

ABSTRACT OF THE DISCLOSURE

A semiconductor device adapted for high temperature processing and the method for making same. A silicon wafer of a given conductivity is provided, a layer of the opposite conductivity being disposed thereon forming a PN junction. Metallized layers are disposed on the top and bottom surfaces of the wafer, a glass substrate being removably secured to each of the metallized layers. After etching, the wafer is adapted to withstand the high temperature processing resulting from glass encapsulation by the alternative disposition of layers of silicon dioxide, silicon nitride and silicon dioxide.

BACKGROUND OF THE INVENTION

(1) Field of the invention

The present invention semiconductor device and method for making same are generally related to the field of semiconductor technology, and are specifically related to those devices and methods used in conjunction with high temperature processing.

(2) Prior art

The methods of fabricating a semiconductor device in a manner adapted to withstand high temperature environments generally and processing specifically, has continued to progress as evidenced by the devices and methods disclosed by the prior art. As an example, high temperature processing becomes necessary where the semiconductor device is being encapsulated in and placed in contact with a glass envelope. This application arises where one or more devices are to be hermetically sealed within a glass envelope for the purpose of being used as an independent entity. This is distinguished from semiconductor devices which are housed in packages which are either not of glass or in which the device is not in intimate adherence with the glass which occurs under high temperature conditions. Since the temperatures required for glass encapsulation of the sort herein contemplated are in a range of temperatures which exceed 700° C., there has been a variety of devices and methods employed to solve the problem. The problem arises out of the effect of the high temperature environment on the body of the semiconductor device, the passivation layer if used on any metal contact layers employed.

Once an active device is fabricated, the PN junction regions must be protected from environmental factors which may adversely affect its characteristics, e.g., the reverse voltage losses. Protection is needed to prevent formation of surface conditions which invert either the P or the N regions, and to prevent concentration of ions which might conduct current under high applied fields in the junction regions. Where encapsulation or other packaging is not used, mechanical protection from dust, weld/shock, etc. is also required.

It is well known that a passivation layer of silicon dioxide ($SiO_2$) can be grown by thermal oxidation methods. Under a typical method disclosed by the prior art, the peripheral surface of a semiconductor wafer exhibiting an exposed PN junction is provided a passivating layer of $SiO_2$ by typical thermal oxidation methods. The wafer is placed in a thermodiffusion furnace having an oxygen environment. The temperature of the furnace is typically 1150° C. Based upon the amount of time the wafer remains in the furnace, a layer of $SiO_2$ will form on the wafer, the thickness of the layer being a function of the oxidation time.

Where the peripheral surface is passivated by thermo-oxidation methods, there would be deleterious effects if metallized layers, e.g., contact layers, were disposed on the semiconductor device prior to oxidation since the melting point of conventional contact metal is substantially below typical oxidation temperatures. Where thermo-oxidation is used, metallization must be carried out after oxidation thereby requiring the time consuming preliminary steps of lapping and cleaning the appropriate surfaces or otherwise preparing the wafer to receive metallization.

The prior art also discloses devices fabricated by using sputtering operations. The devices fabricated pursuant to this method have also required subsequent application of metallized contact since sputtering of $SiO_2$ would contaminate predisposed metallized layers. Where this process is used, the additional time and expense for preparing the wafer will have to be expended thereby rendering the process inefficient. If the devices produced by this known method are subjected to subsequent high temperature process steps such as is enveloped in intimate glass encapsulation, the completed device can suffer from an irreparable defect. Where the peripheral surface is passivated with only a layer of $SiO_2$, the glass will flow at the temperature utilized dissolving some of the $SiO_2$ passivation layer. This effect could also cause penetration into the silicon wafer itself thereby degrading the quality of the semiconductor device to an extent which could not be controlled.

Silicon nitride ($S_3N_4$) has been used in methods and devices disclosed by the prior art, but these have been used for masking layers. The mere use of a silicon nitride layer in addition to an $SiO_2$ layer would produce a device which would not be amenable to the applications described herein. Silicon nitride will not form a sufficient bond to the envelope glass and therefore will be substantially inadequate if employed as disclosed in the prior art.

The present invention semiconductor device and method of fabricating same substantially resolves those problems left unsolved by the prior art. A semiconductor wafer having a PN junction disposed therein is subjected to a metallizing step whereby metallized layers for contact to the appropriate regions are disposed upon the appropriate surfaces of the wafer. Glass substrates are coupled to the metallized layers, after which the exposed PN junction is passivated by the successive disposition of silicon dioxide, silicon nitride and a final layer of silicon dioxide. The resulting device will withstand the temperatures required for glass encapsulation in addition to saving time and expense required by those devices and methods disclosed by the prior art.

SUMMARY OF THE INVENTION

It is an object of the present invention to provide a semiconductor device which will withstand subsequent high temperature processing.

It is another object of the present invention to provide a semiconductor device which will exhibit stable characteristics subsequent to high temperature processing.

It is still another object of the present invention to provide an improved method for fabricating a semiconductor device.

It is still yet another object of the present invention to provide a method of passivating a semiconductor device subsequent to the disposition of metallized layers thereon.

The present invention semiconductor device is implemented pursuant to a method which possesses considerable advantages over those disclosed by the prior art. A semiconductor wafer is provided, the wafer typically being a silicon wafer of N-type conductivity. A P-type region is disposed thereon, thereby providing a wafer having a PN junction disposed therein, the peripheral surfaces of the wafer having the PN junction exposed. The metallized layers are disposed upon the top and bottom surfaces of the wafer, the metallized surfaces providing for electrical contact to the specific regions of the wafer. Independent glass substrates are coupled to the metallized layers on the top and bottom surfaces of the wafer by a suitable adhesive, the adhesive being resistant to conventional silicon etchants. The wafer is cut into a plurality of dice, the cutting operation exposing the PN junction within the wafer. The processed wafer is sequentially subjected to the disposition of silicon dioxide, silicon nitride and a second layer of silicon dioxide. After the wafer is fully passivated, the glass substrates are removed providing a semiconductor device which can either be used as is or be amenable to high temperature processing steps such as are required when a glass encapsulated package is being fabricated.

The novel features which are believed to be characteristic of the invention, both as to its organization and method of operation, together with further objectives and advantages thereof, will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

DESCRIPTION OF THE PRESENTLY PREFERRED EMBODIMENT

Figure 1:
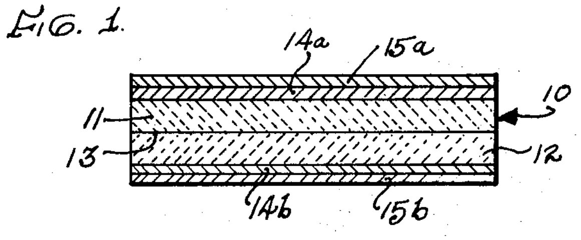
FIG. 1 is a sectional view of a semiconductor wafer with metallized layers disposed thereon.

Referring now to FIG. 1, the present invention method is initialized by the provision of a semiconductor wafer generally designated by the reference numeral 10. Semiconductor wafer 10 is typically a silicon wafer of N-type conductivity but semiconductor wafer 10 could be fabricated of other conventional semiconductor materials and be of P-type conductivity. The next step in the present invention method is the formation of a PN junction within semiconductor wafer 10. A region of P-type conductivity 11 is disposed upon silicon wafer 10, P-type region 11 being formed by conventional methods, but preferably by diffusion. Although diffusion is the preferable process for forming region 11 of P-type conductivity, other conventional methods such as epitaxial growth could be employed. After the diffusion of P-type region 11, silicon wafer 10 comprises P-type region 11, N-type region 12 and PN junction 13 disposed intermediate the two regions 11 and 12. Although the P-type and N-type regions 11 and 12 are shown to be equal in size, the physical dimensions of the regions 11 and 12 are based upon the physical characteristics of the semiconductor device being formed, that shown in FIG. 1 being for the purpose of illustration only.

After the formation of PN junction 13, metallized contacts for making electrical contact to the active regions 11 and 12 of silicon wafer 10 are disposed upon silicon wafer 10. The metallized contacts secured to silicon wafer 10 can be conventional contact metal, but the preferred embodiment of the present invention semiconductor device utilizes dual layers 14 and 15 of nickel and gold respectively. Metal layers **14*a* and 14*b* are disposed upon the active regions 11 and 12 of silicon wafer 10 respectively by conventional methods, but preferably through electroless nickel plating. The P-type and N-type regions 11 and 12 are treated in an electroless nickel plating solution to provide a thin film of nickel on the active regions of silicon wafer 10. The process requires that silicon wafer 10 be immersed in an aqueous solution typically containing nickelous chloride, the bath being kept at a precise pH level and at a constant temperature. The device is then removed from the bath and sintered to diffuse some of the nickel into the active regions 11 and 12 of silicon wafer 10 thereby providing an inherent bond between the surfaces of silicon wafer 10 and the nickel layers 14*a* and 14*b*. As mentioned hereinabove, although nickel provides good electrical contact to silicon, metal layers 14*a* and 14*b* could comprise other conventional contact metals. In order to protect the metal layers 14*a* and 14*b*, metal layers 15*a* and 15*b* are disposed upon metal layers 14*a* and 14*b* respectively. Metal layers 15*a* and 15*b* can be conventional contact metals which are compatible with metal layers 14*a* and 14*b* but where metal layers 14*a* and 14*b* are fabricated of nickel, metal layers 15*a* and 15*b*** are preferably fabricated of gold.

Figure 2:
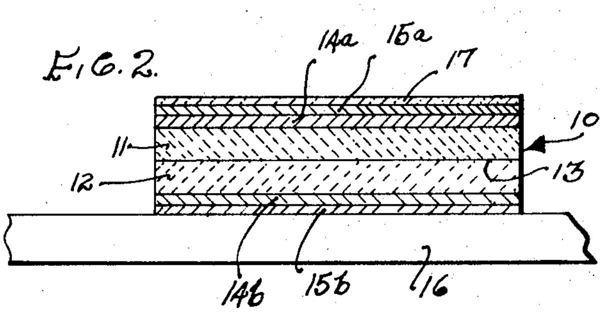
FIG. 2 is a sectional view of the wafer of FIG. 1 with glass substrate coupled thereto.

The next steps in the present invention can be best understood by reference to FIG. 2. Silicon wafer 10 is mounted upon glass substrate 16 along the surface of metal layer **15*b*, semiconductor wafer 10 being mounted by an adhesive which will not chemically react during sputtering or etching operations. Adhesives having the above characteristics are conventional and are commercially available. Glass substrate 17 is mounted upon metal layer 15*a* with the same adhesive used to mount silicon wafer 10 upon glass substrate 16. Whereas there is no limit as to the thickness of glass substrate 16, glass substrate 17 will typically have a thickness of 5–6 mils to facilitate the subsequent process steps. After glass substrates 16 and 17 have been mounted and secured to silicon wafer 10, the mounted silicon wafer 10 will be heat cured to prevent inadvertent dislodgment of either of the two glass substrates 16 and 17 from the respective metal layers 15*b* and 15*a***.

Figure 3A:
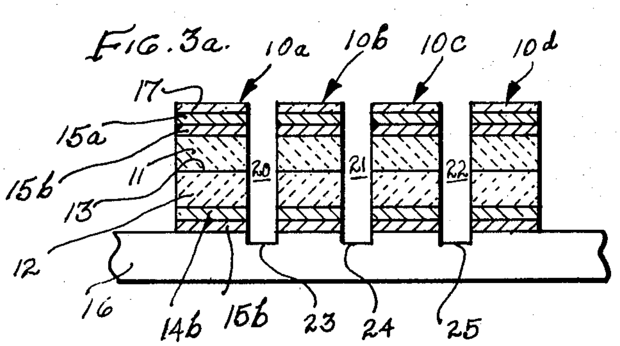
FIGS. 3*a*, 3*b* and 3*c* illustrate sequential process steps in accordance with the present invention.

The next step in the present invention method can be best seen by reference to FIG. 3*a*. The silicon wafer 10 is cut into a plurality of dice **10*a*, 10*b*, 10*c* and 10*d*, the manner of forming the dice being by conventional cutting methods, but preferably through the use of ultrasonic techniques. For the purpose of illustration, silicon wafer 10 is shown to have apertures 20, 21 and 22 disposed between the remaining dice 10*a*, 10*b*, 10*c* and 10*d*, the apertures 20, 21 and 22 extending into glass substrate 16 to form indentations 23, 24 and 25. The transverse dimension across silicon dice 10*a*, 10*b*, 10*c* and 10*d* is a suitable distance commensurate with the specific semiconductor device being formed, the transverse distance typically being approximately 10 mils. Although ultrasonic cutting is the preferable manner for forming apertures 20, 21 and 22 other conventional cutting processes could be used such as chemical etching, the manner of forming apertures 20, 21 and 22** not being part of the present invention.

Figure 3B:
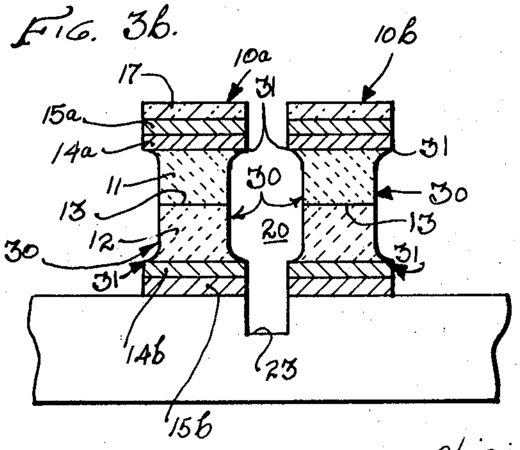
Figure 3C:
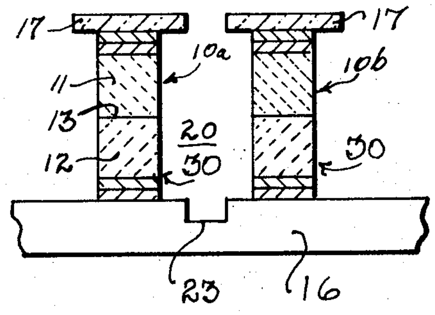

Referring now to FIG. 3*b*, the next step in preparing the present invention semiconductor device can be best understood. The step of forming apertures 20, 21 and 22 leaves a peripheral surface which is totally unusable as a final device, therefore the structure comprising glass substrates 16 and 17 and the silicon dice 10 are immersed in an etching solution suitable to etch portions of the silicon wafer 10 without reacting with the glass substrates 16 and 17, metal layers 14 and 15 or the adhesive disposed between the glass substrates 16 and 17 and the metal layers 14 and 15. A suitable etching solution to provide a controlled rate of etching is a solution of nitric acid, hydrofluoric acid and acetic acid. A solution of this type will react with the silicon regions 11 and 12 etching same at a controlled rate. The etchants will have substantially no reaction with the gold layer 15 and only a limited reaction with the nickel layer 14. Silicon dice **10*a* and 10*b* will remain in the etching solution until the peripheral surfaces 30 have been substantally cleared of the damage caused by the ultrasonic cutting. Approximately 5 mils will be etched from peripheral surface 30. The peripheral surfaces 30 formed by the application of the etchant will be passivated in later steps of the present invention method, but prior to such passivation, the portions 31 of metal layers 14 and 15 must be removed from silicon dice 10*a* and 10*b*. The overhanging portions 31 of metal layers 14 and 15 would create a shadowing effect when the total structure is exposed to a sputtering operation, therefore prior to the use of the sputtering operation, the overhanging portions 31 will be removed pursuant to a conventional etching process. The mounted silicon dice are immersed in a conventional etchant suitable to react with the nickel and gold metal layers 14 and 15 but one which would leave the peripheral surface 30 of silicon dice 10*a* and 10*b*** substantially intact. A suitable etchant for this purpose is a solution of hydrochloric acid and nitric acid. Referring to FIG. 3*c*, the exemplary structure comprising the two silicon dice **10*a* and 10*b* with the mounted glass substrate 16 and 17 is shown therein. Pursuant to the process steps, the overhanging portions 31 of metal layers 14 and 15** have been removed.

Prior to the passivation of silicon dice **10*a* and 10*b*** as shown in FIG. 3*c*, the peripheral surfaces 30 are subjected to a polish etching. The polish etching is much less reactive than that utilized in the prior steps, the polish etching acting to smooth peripheral surfaces 30 and improving the electrical characteristics of the subsequent device. After re-etching silicon dice **10*a* and 10*b* they are washed and typically dried in a gas stream of dry nitrogen. The manner in which the silicon dice 10*a* and 10*b*** are cleaned can be by conventional methods, but dry nitrogen is preferred due to its inert characteristics thereby precluding contamination of the devices.

Figure 4:
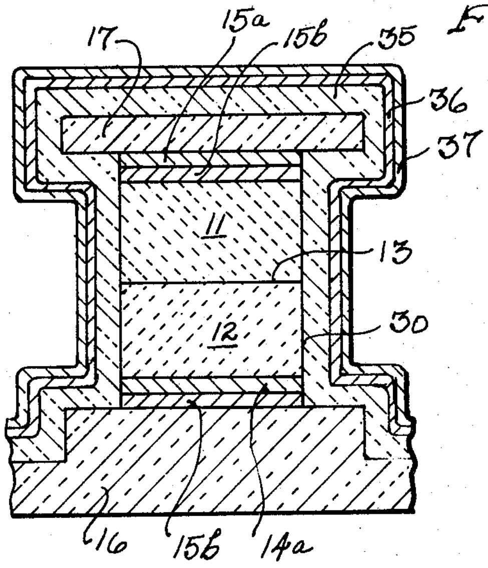
FIG. 4 is a sectional view of a semiconductor wafer prepared in accordance with the present invention.

The ability of the present invention semiconductor device to withstand subsequent high temperature processing steps resulting from the intimate contact of glass encapsulation can be best understood by reference to FIG. 4 wherein an enlarged silicon dice 10 is shown, the silicon dice having been processed pursuant to that discussed hereinabove. In order to maintain the characteristics of semiconductor dice, peripheral surface 30 must be passivated and thereby protected from penetration by the glass during encapsulation. A layer 35 of silicon dioxide is disposed upon peripheral surface 30. Since metal layers 14 and 15 have been bonded to silicon wafer 10, silicon dioxide layer 35 cannot be disposed pursuant to thermo-oxidation techniques because of the damaging temperature incident thereto. Silicon dioxide layer 35 is disposed upon silicon wafer 10 by sputtering. Although the preferred process for disposing silicon dioxide layer 35 upon the silicon wafer 10 is by sputtering, other conventional methods which utilize temperature environments in the same range as sputtering can be used. Silicon dioxide layer 35 is typically in the range of 5,000–6,000 angstroms. Since the entire structure is placed within a sputtering chamber, silicon dioxide layer 35 will be disposed upon the surface of the glass substrates 16 and 17 as well as peripheral surface 30 of silicon wafer 10. Since the external surfaces of metal layer 15 are shielded by glass substrates 16 and 17, silicon dioxide layer 35 will in no way contaminate or degrade the electrical characteristics of metallized layers 14 and 15.

As mentioned hereinabove, a single layer of silicon dioxide will not adequately protect a semiconductor device where same is to be subsequently placed in intimate contact with flowing glass during encapsulation. If silicon dioxide layer 35 was the sole layer used to provide passivation of silicon wafer 10, glass flowing during high temperature processing could cause some of the silicon dioxide layer 35 to dissolve with probable penetration of silicon wafer 10 itself by the glass. Such an effect would substantially degrade the characteristics of the semiconductor device being fabricated. In order to overcome this problem, a layer 36 of silicon nitride is disposed upon silicon dioxide layer 35. Silicon nitride layer 36 can be disposed by conventional disposition methods, but it is preferably disposed by sputtering. Where a silicon bar is used as a source of the passivation layer, the disposition of silicon nitride layer 36 can easily be accomplished by purging the sputtering chamber of its oxygen atmosphere and replacing same with a nitrogen atmosphere. Silicon nitride layer 36 provides a barrier which protects silicon dioxide layer 35 and silicon wafer 10 lying thereunder. Silicon nitride layer 36 protects silicon dioxide layer 35 because it is impervious to ions such as sodium which are typically present in glass and which would otherwise penetrate silicon dioxide layer 35 and silicon wafer 10. By preventing penetration of silicon dioxide layer 35 and silicon wafer 10, instability of the characteristics of the semiconductor device is prevented. Silicon nitride layer 36 should be sputtered to a depth of approximately 1,000 angstroms or more.

In order to meet the objects of the present invention, the characteristics of silicon nitride when interfaced with glass must be overcome. Although silicon nitride layer 36 will prevent degradation of silicon dioxide layer 35 by the encapsulating glass, silicon nitride layer 36 will not sufficiently bond to envelope glass. To solve this problem, silicon dioxide layer 37 is disposed upon silicon nitride layer 36, silicon dioxide layer 37 typically being disposed by conventional methods such as sputtering. Silicon dioxide layer 37 should be sputtered to a depth of approximately 2,000 angstroms. The disposition of the multiple layers as shown in FIG. 4 yield a device which has highly stable characteristics as well as being amenable to subsequent high temperature processing.

Figure 5:
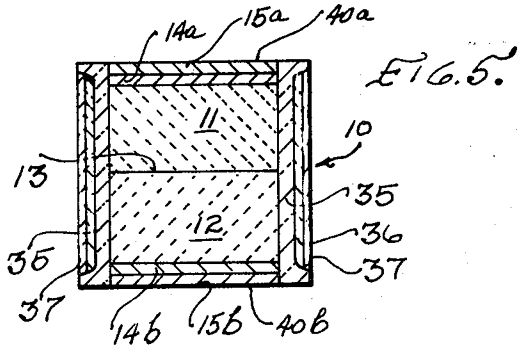
FIG. 5 is a completed form of the present invention semiconductor device.

Referring now to FIG. 5, a semiconductor device in accordance with the present invention is shown therein. In order to place silicon wafer 10 in proper form for use as a semiconductor device, glass substrates 16 and 17 must be removed from metal surfaces **15*a* and 15*b*. In addition, the excess portions of passivating layers 35, 36 and 37 must be removed. The first step in the present invention method to place the semiconductor device in condition for operation is to place the structure as shown in FIG. 4 in a solution of solvent which is suitable to dissolve the adhesive securing glass substrate 16 to metal layer 15*b* and glass substrate 17 to metal layer 15*a*. A typical solvent for dissolving the adhesive is dimethylformamide. Glass substrates 16 and 17 will be released from the surfaces of metal layers 15*a* and 15*b* when subjected to the appropriate solvent. The remaining structure is then washed to remove the impurities. The glass substrate 17 and 16 protected surfaces 40*a* and 40*b* of metal layers 15*a* and 15*b* respectively, the surfaces 40*a* and 40*b* being substantially clean of any impurities or matter disposed during the sputtering process. The resulting chip shown in FIG. 5 is totally passivated along the peripheral surface thereof, with the metal surfaces contacting active regions 11 and 12** suitable for making electrical contact thereto.

Figure 6:
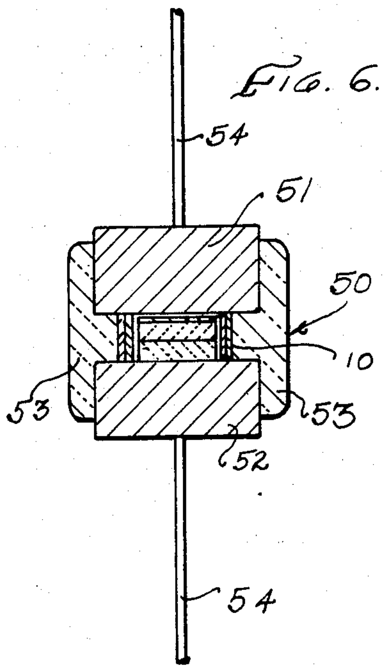
FIG. 6 is a glass encapsulated semiconductor device in accordance with the present invention.

Referring now to FIG. 6, an exemplary package for the present invention semiconductor device is shown therein, the packaging shown in FIG. 6 requiring high temperature processing, the package shown in FIG. 6 being generally designated by the reference numeral 50. Package 50 is typically called a double slug package since the contacting surfaces of the semiconductor device are abutted against and secured to metal slugs 51 and 52 with the semiconductor device 10 thereafter hermetically sealed and placed in intimate contact with glass encapsulation 53. Leads 54 make electrical contact to metal slugs 51 and 52 thereby completing the double slug package 50. Metal slugs 51 and 52 and metal contacts 54 are conventional contact metals, the specific metal used to implement same not being part of the present invention.

In order to fabricate double slug package 50, semiconductor device 10 will have to be subjected to the high temperature processing step needed to encapsulate metal slugs 51 and 52 and semiconductor device 10 in glass envelope 53. The temperatures required to complete the glass encapsulation is typically in a range exceeding 700° C. Since the peripheral surface of semiconductor device 10 is protected by passivating layers 35, 36 and 37 of silicon dioxide, silicon nitride and silicon dioxide respectively, glass 53 when flowing under the effect of the high temperature will not penetrate silicon dioxide layer 35 and thereby degrade or totally destroy semiconductor device 10.

The present invention semiconductor device provides a structure which can be processed at high temperatures and in addition provides a device which exhibits characteristics which are substantially more stable than one which is not subjected to the present invention method. Construction of the semiconducor device pursuant to the present invention method obviates heretofore necessary, difficult and time-consuming steps thereby providing a device and method which are more efficient, more economical and yield better results. Although the semiconductor device described hereinabove is typically the structural equivalent of a semiconductor diode, the present invention, method and product thereof can be equally applied to the fabrication of other types of semiconductor devices, such as a transistor. In addition, the present invention method can be used to fabricate a semiconductor device utilizing no active regions but which will be subjected to high temperature steps inherent to glass encapsulation. At typical example of this type of device would be a strain guage fabricated of semiconductor material. Fabrication of a device such as this pursuant to the present invention method would yield a device which would be amenable to high temperature processing steps as well as subsequent operations in high temperature environments.

I claim:

1. A method for the fabrication of a semiconductor device suitable for high temperature processing comprising the steps of:

(a) providing a semiconductor wafer of a predetermined conductivity having first, second and third portions;

(b) disposing a contact metal layer upon each of the first and second portions of said semiconductor wafer;

(c) securing a glass layer upon each of said contact metal layers, whereby said glass layers protect said contact metal layers;

(d) passivating the third portion of said semiconductor wafer; and (e) removing said glass layers from said contact metal layers.

2. A method as in claim 1 wherein a semiconductor wafer having at least one PN junction is provided.

3. A method as in claim 1 wherein said semiconductor wafer is a silicon wafer.

4. A method for the fabrication of a semiconductor device adapted to withstand the high temperature environments of glass encapsulation comprising the steps of:

(a) providing a silicon wafer of predetermined conductivity having at least two active regions therein and having top, bottom and peripheral surfaces;

(b) disposing contact metal layers upon the top and bottom surfaces of said silicon wafer, said contact metal layers in electrical contact with said active regions;

(c) removably securing first and second glass substrate to each of said contact metal layers respectively;

(d) preparing the peripheral surface of said silicon wafer to receive passivation;

(e) disposing upon said peripheral surface a first passivating layer of silicon dioxide;

(f) disposing a second passivating layer of silicon nitride upon said first passivating layer;

(g) disposing a third passivating layer of silicon dioxide upon said second passivating layer; and (h) removing said first and second glass substrate exposing said contact metal layers.

5. A method as in claim 4 wherein said silicon dioxide passivating layers are disposed by sputtering.

6. A method as in claim 4 wherein the thickness of said passivating layer of silicon nitride is at least 1,000 angstroms.

7. A method as in claim 4 wherein said contact metal layers comprise a first layer of nickel and a second layer of gold.

8. A method for the fabrication of a semiconductor device for use in the high temperature environments of glass encapsulation comprising the steps of:

(a) providing a silicon wafer of N-type conductivity having a top, bottom and peripheral surface and having at least two active regions therein integral with said surfaces;

(b) disposing a metallic layer of nickel upon said top and bottom surfaces of said silicon wafer whereby said layers make electrical contact to the active regions of said silicon wafer;

(c) disposing a metallic layer of gold upon said metallic layers of nickel;

(d) adhesively securing first and second glass substrate to each of said metallic layers of gold whereby the surfaces of said metallic layers of gold are protected;

(e) preparing the peripheral surface of said silicon wafer for receiving passivation;

(f) disposing a first layer of silicon dioxide upon the peripheral surface of said silicon wafer whereby said peripheral surface is protected;

(g) disposing a layer of silicon nitride upon said first layer of silicon dioxide;

(h) disposing a second layer of silicon dioxide upon said layer of silicon nitride; and, (i) removing said first and second glass substrate exposing the surfaces of said metallic layers of gold.

9. A method as in claim 8 wherein said layer of silicon nitride is disposed to a depth of at least 1,000 angstroms.

10. A method as in claim 8 wherein said first and second layers of silicon dioxide and said layer of silicon nitride are disposed by sputtering.

References Cited

UNITED STATES PATENTS 3,525,680 8/1970 Davidse et al. ------- 204—192

HOWARD S. WILLIAMS, Primary Examiner

S. S. KANTER, Assistant Examiner

U.S. Cl. X.R.

156—2; 317—234 R